(12) United States Patent
Asao

(10) Patent No.: US 6,359,352 B2
(45) Date of Patent: *Mar. 19, 2002

(54) VEHICULAR AC GENERATOR

(75) Inventor: Yoshihito Asao, Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/479,905

(22) Filed: Jan. 10, 2000

(30) Foreign Application Priority Data

Jul. 22, 1999  (JP) ............................................ 11-207468

(51) Int. Cl.$^7$ ............................. H02K 7/20; H02K 9/02; H02K 3/28
(52) U.S. Cl. ....................... 310/68 D; 310/64; 310/112; 361/697
(58) Field of Search ........................ 310/64, 112, 68 D; 361/688, 697, 702, 703, 709; 318/140, 141, 558

(56) References Cited

U.S. PATENT DOCUMENTS

| | | | | |
|---|---|---|---|---|
| 3,562,564 A | * | 2/1971 | Potter ........................... | 310/54 |
| 3,866,072 A | * | 2/1975 | Nagai ......................... | 310/68 D |
| 4,103,193 A | * | 7/1978 | Ito ............................. | 310/68 D |
| 4,307,437 A | * | 12/1981 | Severing ..................... | 361/386 |
| 4,419,597 A | * | 12/1983 | Shiga et al. ............... | 310/68 D |
| 4,626,750 A | * | 12/1986 | Post ............................ | 318/139 |
| 4,799,309 A | * | 1/1989 | Cinzori et al. ................ | 29/596 |
| 4,835,427 A | * | 5/1989 | Bohm et al. .............. | 310/68 D |
| 5,164,624 A | * | 11/1992 | Desai et al. .............. | 310/68 D |
| 5,424,594 A | * | 6/1995 | Saito et al. ............... | 310/68 D |
| 5,640,062 A | * | 6/1997 | Yockey .................... | 310/68 D |

FOREIGN PATENT DOCUMENTS

| | | | |
|---|---|---|---|
| EP | 720 273 | 7/1996 | |
| GB | 2 273 394 | 6/1994 | |
| GB | 2 334 815 | 9/1999 | |
| JP | 58-218873 | 12/1983 | ............ H02M/7/06 |
| JP | 4-26345 | * 1/1992 | |
| JP | 4-42759 | * 2/1992 | |
| JP | 6-178479 | 6/1994 | ............ H02K/3/28 |

* cited by examiner

*Primary Examiner*—Bentsu Ro
(74) *Attorney, Agent, or Firm*—Sughrue Mion, PLLC

(57) ABSTRACT

The invention reduces ripples of a rectified output caused by setting a neutral-point diode and improves a generated output by preventing excessive heat generation. First and second stator windings are configured by Y-connecting a pair of three windings on a common stator core so as to have a phase difference of 30° from each other. A rectifier device includes a first and a second rectifier for rectifying and outputting a phase current derived from an end of each of the windings and a neutral-point current derived from a neutral point of each of the windings. Outputs of each of the rectifiers are synthesized to generate a synthesized output at an output terminal. The first and second rectifiers have rectifying diodes and neutral-point diodes disposed on a common heat sink.

6 Claims, 17 Drawing Sheets

VEHICULAR AC GENERATOR

BACKGROUND OF THE INVENTION

1. Field of the Invention

The present invention relates to a vehicular AC generator having a pair of Y-connection circuits.

2. Description of the Related Art

For a conventional vehicular three-phase generator as disclosed in, for example, Japanese Patent Application Laid-Open No. 58-218873 shown in FIG. 15, neutral-point diodes 23N and 25N configuring a neutral-point-current rectifying circuit are connected between a high-potential output side of a rectifier device 12 and a neutral point N of a stator coil 16 and between a low-potential output side of the rectifier device 12 and the neutral point N of the stator coil 16 and a three-phase voltage output of the stator coil 16 configured by a three-phase armature in which three windings Y are connected in a Y form is applied to rectifying diodes 23 and 25 of the rectifier device 12 for full-wave-rectifying the three phase voltage.

A vehicular three-phase generator has excellent characteristics in that output can be increased without increasing the size of the generator by providing the neutral-point-current rectifying circuit 12 having the neutral-point diodes 23N and 25N.

Specifically, the neutral-point diodes 23N and 25N are added to the rectifier device 12, so that an exciting current circulating through each winding Y and the rectifier device 12 is derived from the neutral point N of the stator coil 16 so as to be supplied to the stator coil 16 and the rectifier device 12, thereby improving the output of the generator. This type of vehicular three-phase generator is widely used at present.

The configuration of a conventional vehicular three-phase generator will be described below with reference to the accompanying drawings. FIG. 13 is a sectional side view of the conventional vehicular three-phase generator (hereafter referred to as an AC generator) and FIG. 14 is an internal view showing the interior of a rear bracket 2 shown in FIG. 13.

The AC generator includes a case 3 formed of an aluminum front bracket 1 and a rear bracket 2, a shaft 6 provided in the case 3 and having a pulley 4 fixed at one end thereof, a Landolt-type rotor 7 secured to the shaft 6, a fan 5 secured to the opposite side surfaces of the rotor 7, a stator 8 secured to an inner wall surface of the case 3, a slip ring 9 for supplying current to a rotor coil 13 fixed to the other end of the shaft 6, a pair of brushes 10 slidable on the slip ring 9, a brush holder 11 receiving therein the brushes 10, a rectifier device 12 electrically connected to a stator coil 16 for rectifying an AC voltage generated in the stator coil 16 into a DC voltage, a heat sink 19 fitted to the brush holder 11, and a regulator 20 connected to the heat sink 19 for adjusting the field current to be supplied to the stator coil 16 in accordance with the output of the generator.

The rotor 7 comprises the rotor coil 13 for generating a magnetic flux and a pole core 14 covering the rotor coil 13 and on which magnetic poles are formed by the magnetic flux. The pole core 14 is comprised of a pair of a first pole-core body 21 and a second pole-core body 22 engaged with each other. The first pole-core body 21 and the second pole-core body 22 are made of iron and are respectively provided with a plurality of pawl-shaped magnetic poles 21a and 22a.

The stator 8 comprises a stator core 15 and a stator coil 16 in the form of a conductor made of copper and wound on the stator core 15. An AC voltage is generated due to the changing magnetic flux supplied from the rotor coil 13 in accordance with the rotation of the rotor 7. As shown in FIG. 14, a plurality of slots 17 are provided on the stator core 15 in the radial direction thereof with their open portions facing the axis of rotation, and the stator coil 16 is wound in each slot 17.

The rotor coil 13, stator coil 16, rectifier device 12 and regulator 20 normally generate heat while the generator generates power. A generator having a class 100A rated output current shows a calorific value of 60, 500, 120 or 6 W in the respective portions 13, 16, 12 and 20 at a relatively high-temperature rotation point.

To cool the heat produced by power generation, intake ports are provided in the front bracket 1 and the rear bracket 2, respectively, for taking in cooling air from the outside with the fan 5 set on the shaft 6. The cooling air taken in through the intake port of the rear bracket 2 passes through the rear-bracket-side heat sinks 24, 24 of the rectifier device 12 and a vent hole formed facing the regulator heat sink 19 to cool the rectifier device 12 and the regulator 20.

The cooling air cools the rectifier device 12 and the regulator 20 while passing through them, and is then directed in the centrifugal direction by the rear-bracket-side fan 5 to cool the rear-bracket-side stator coil end so as to be discharged to the outside through a bracket exhaust port.

Moreover, the cooling air drawn in the axial direction from the front-bracket-side intake port is directed in the centrifugal direction by the fan 5 to cool the front-bracket-side stator coil end and then discharged to the outside through a bracket exhaust port similar to the case of the rear bracket 2 side.

As shown in FIG. 14, the rectifier device 12 comprises the positive-pole-side heat sink 24 for supporting a plurality of positive-pole-side diodes 23 and a neutral-point diode 23N, a negative-pole-side heat sink 26 for supporting a plurality of negative-pole-side diodes 25 and a neutral-point diode 25N, and a circuit board 27 for electrically connecting anodes of the diodes 23 and 23N, cathodes of the diodes 25 and 25N, and the stator coil 16. A three-phase voltage generated in the stator coil 16 is full-wave-rectified by the rectifier device 12 having the diodes 23 and 25.

As shown in FIGS. 16 to 18, the rectifier device 12 including a heat sink and the like is configured so that the entirety thereof forms an approximate horseshoe shape. This configuration is used to store components by efficiently using the space in the generator because the shape of the generator is roughly cylindrical. As shown in FIGS. 16 and 17, the heat sinks 24 and 26 are made of aluminum or the like so as to radiate the heat produced by the diodes 23, 25, 23N, and 25N.

The heat sink 24 has a plurality of fins F protruding toward the rotor axis from the back of a joint surface between the positive-pole-side diodes 23 and 23N. Moreover, the heat sink 26 for joining the negative-pole-side diodes 25 and 25N is directly connected at its back side to the rear bracket 2 as a ground.

The diodes 23, 25, 23N, and 25N are molded, roughly rectangular and connected to the circuit board 27 by lead terminals protruding from one side of the diodes. The diodes 23, 25, 23N, and 25N are arranged on the heat sinks 24 and 26 in the radial direction so that they do not interfere with each other.

Among the diodes 23, 25, 23N, and 25N, the neutral-point diodes 23N and 25N are arranged so as to face a connector C for transferring a signal to and from the regulator 20 through the open portion of the slip ring.

Recently, in response to requests for increasing the output of AC generators due to the increased electric loads of vehicles, the output of generators has thus far been improved by adding a neutral-point diode to a full-wave rectifying circuit so as to derive an exciting current for circulating through windings and a full-wave rectifier device from the neutral point of a three-phase armature winding, and by using the exciting current with the three-phase armature winding and the full-wave rectifier device.

However, when a neutral-point diode is added to a full-wave rectifying circuit, a ripple current is output from the neutral-point diode and a ripple voltage is superimposed on a rectified output voltage and becomes power-supply noise, which affects other control components.

As for AC generators for improving output without using a neutral-point diode, it has been found that the pawl-like magnetic poles of the generator resonate at certain high-speed-rotational regions to cause undesirable electromagnetic noise. Therefore, the addition of a neutral-point diode, which is preferable for the above reason, is a technological contradiction.

Moreover, in vehicular AC generators, the rotor coil, stator coil, rectifier and regulator constantly produce heat under power generation. AC generators having a rated output current of class 100A shows a calorific value of 60, 500, 120 or 6 w in respective portions thereof at a relatively high-temperature rotation point, as referred to before, and hence electric circuitry is exposed to severe thermal conditions. Particularly, owing to the fact that the rectifier device is located at the cooling-air intake side of a rear-bracket-side cooling fan, and hence the cooling-air speed is low and the heat transfer characteristics are inferior, it is required that the rectifier device is equipped with a cooling heat sink.

However, the layout dimensions of the rectifier are limited by the arrangement of other components. Therefore, even if heat sinks at the positive-pole side and negative-pole side of diodes are enlarged in the range of the limited mounting space of the rectifier, the range of enlargement is limited.

Therefore, when adding not only diodes for full-wave rectification (hereafter referred to as full-wave rectifying diodes) but also a neutral-point diode to a heat sink having the limited enlargement range, the heat-sink area per full-wave rectifying diode is decreased and the cooling performance is deteriorated in order to ensure space for the neutral-point diode. When the cooling performance is deteriorated and the neutral-point diode is also used to improve the generated output, a problem occurs in that the amount of heat produced by the full-wave rectifying diodes are further increased.

Moreover, by adding the neutral-point diode, problems occur in that not only is the cooling performance deteriorated but also, other components cannot be arranged because of insufficient space or the cost increases due to the increased number of neutral-point diodes.

SUMMARY OF THE INVENTION

The present invention is intended to solve the above problems and has for its object to provide a vehicular AC generator capable of improving the generated output by preventing excessive heat generation while reducing ripples in the rectified output cased by the installation of neutral-point diodes.

Bearing the above object in mind, according to a first aspect of the present invention, there is provided a vehicular AC generator comprising: first and second Y-shaped three-phase connection stator windings having a Y-connection formed on a common stator core such that a pair of three windings have a phase difference of 30° from each other; and a rectifier device comprising a first rectifier for rectifying and outputting a phase current derived from an end of each winding of the first Y-shaped three-phase connection stator winding and a neutral-point current derived from a neutral point of the first stator winding and a second rectifier for rectifying and outputting a phase current derived from an end of each winding of the second Y-shaped three-phase connection stator winding and a neutral-point current derived from a neutral point of the second stator winding, the first and second rectifiers each generating a synthesized output at an output terminal; wherein the first and second rectifiers each have phase-current rectifying diodes and neutral-point-current rectifying diodes disposed on a common heat sink.

In a preferred form of the first aspect of the invention, the neutral-point-current rectifying diodes of the first and second rectifiers are disposed on the heat sink at locations next to a phase-current rectifying diode which will reach the highest temperature among the phase-current rectifying diodes.

In another preferred form of the first aspect of the invention, the neutral-point-current rectifying diodes of the first and second rectifiers are disposed at opposite sides of the output terminal, and the phase-current rectifying diodes are disposed on the heat sink at locations next to each of the neutral-point-current rectifying diodes.

In a further preferred form of the first aspect of the invention, the neutral-point-current rectifying diodes of the first and second rectifiers are disposed at either a negative-pole side or a positive-pole side of the rectifiers.

According to a second aspect of the present invention, there is provided a vehicular AC generator comprising: first and second Y-shaped three-phase connection stator windings having a Y-connection formed on a common stator core so that a pair of three windings have a phase difference of 30° from each other; and a rectifier device comprising a first rectifier for rectifying and outputting a phase current derived from an end of each winding of the first Y-shaped three-phase connection stator winding and a neutral-point current derived from a neutral point of the first stator winding, and a second rectifier for rectifying and outputting a phase current derived from an end of each winding of the second Y-shaped three-phase connection stator winding, the first and second rectifiers being each disposed to generate a synthesized output at an output terminal; wherein the first rectifier has phase-current rectifying diodes and the second rectifier has phase-current rectifying diodes and neutral-point-current rectifying diodes, the phase-current rectifying diodes of the first rectifier and the phase-current rectifying diodes and the neutral-point-current rectifying diodes of the second rectifier being disposed on a common heat sink.

In a preferred form of the second aspect of the invention, the neutral-point-current rectifying diodes of the second rectifier are disposed on a heat sink at locations next to a phase-current rectifying diode that will reach the highest temperature among the phase-current rectifying diodes.

In another form of the second aspect of the invention, the phase-current rectifying diodes of the first and second rectifiers are disposed at opposite sides of an output terminal on the heat sink, and the neutral-point-current rectifying diodes are disposed between the output terminal and the phase-current rectifying diodes.

In a further form of the second aspect of the invention, the neutral-point-current rectifying diodes of the second rectifier are disposed at either a negative-pole side or a positive-pole side of the second rectifier.

The above and other objects, features and advantages of the present invention will become more readily apparent from the following detailed description of a few preferred embodiment of the invention when taken in conjunction with the accompanying drawings.

DESCRIPTION OF THE PREFERRED EMBODIMENTS

Embodiment 1

Figure 1:
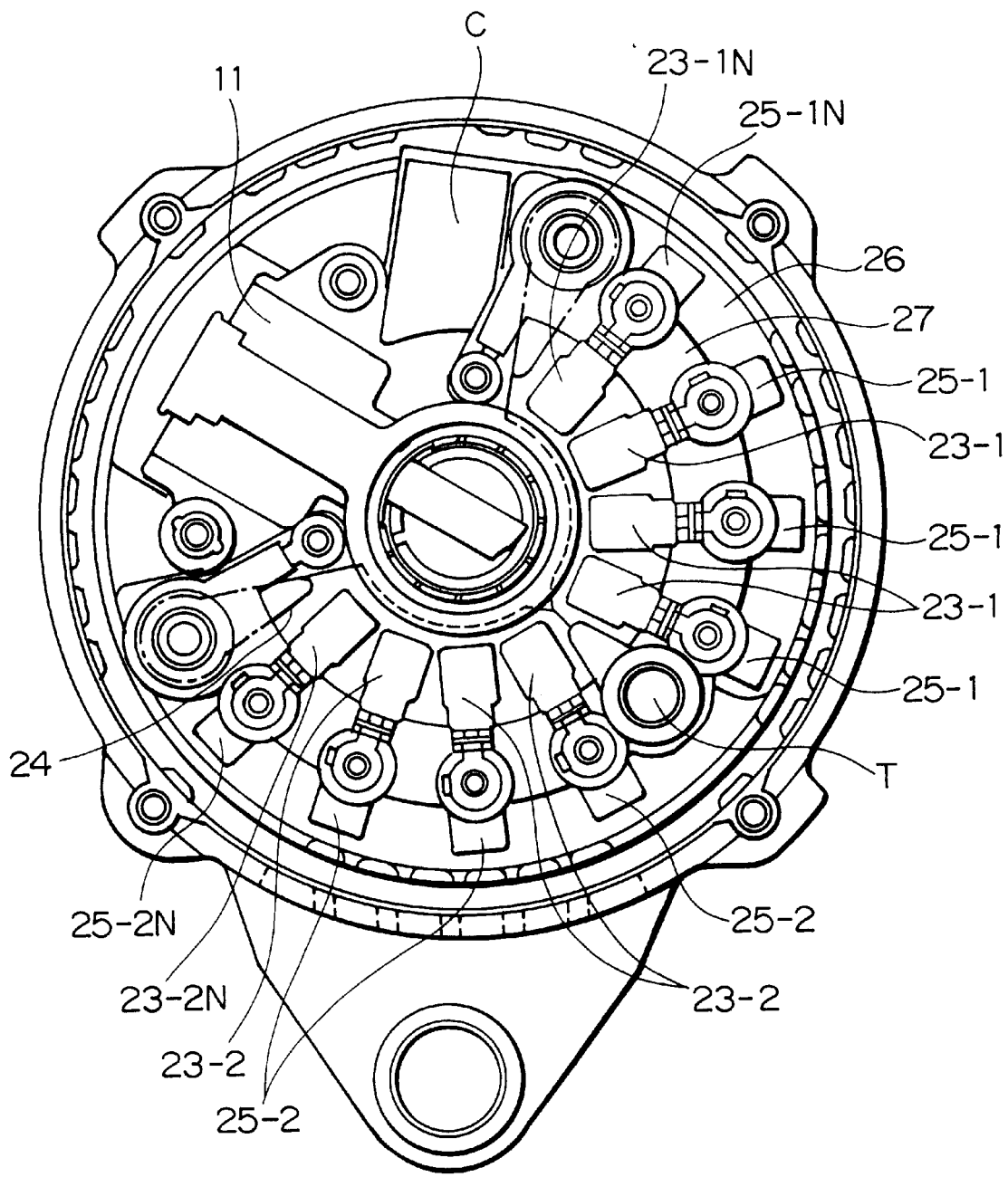
FIG. 1 is an internal view of the rear bracket of the vehicular AC generator of an embodiment 1;.
Figure 2:
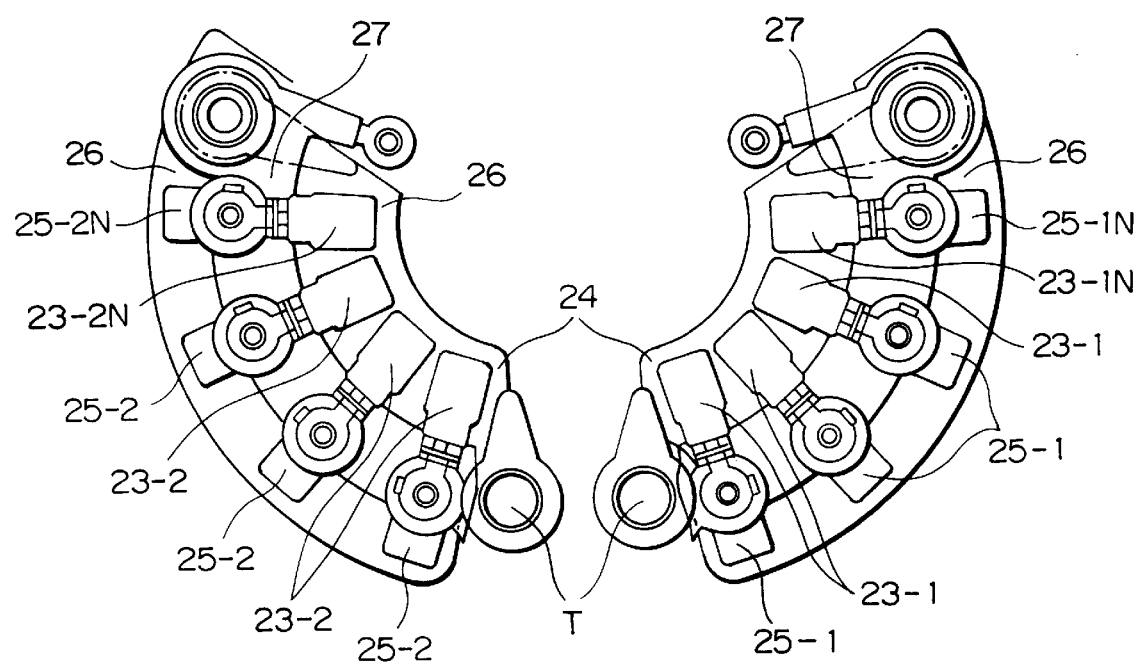
FIG. 2 is an illustration showing two rectifier devicees of the embodiment 1.
Figure 3:
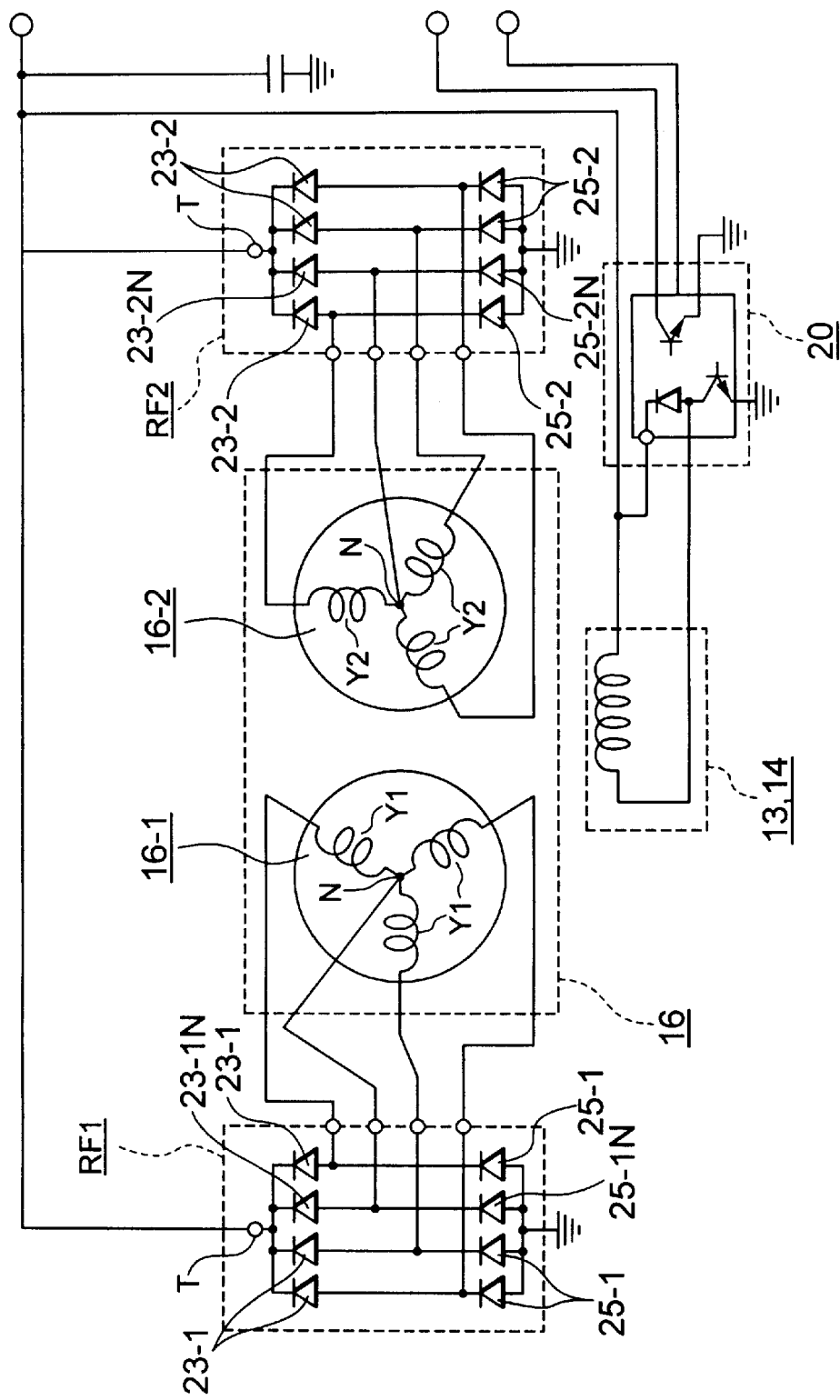
FIG. 3 is a circuit diagram of the vehicular AC generator of the embodiment 1.
Figure 13:
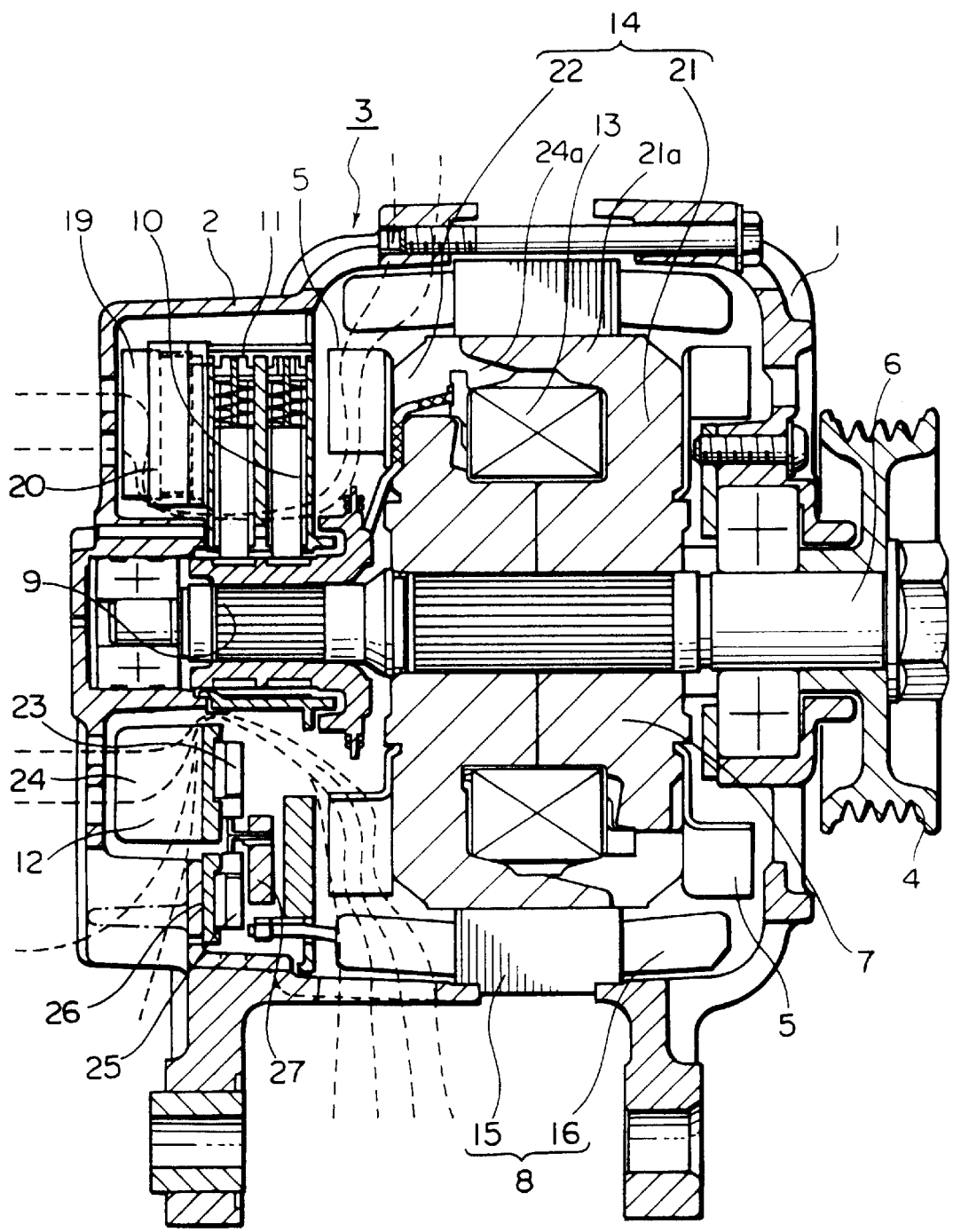
FIG. 13 is a sectional side view of a conventional vehicular three-phase generator.
Figure 14:
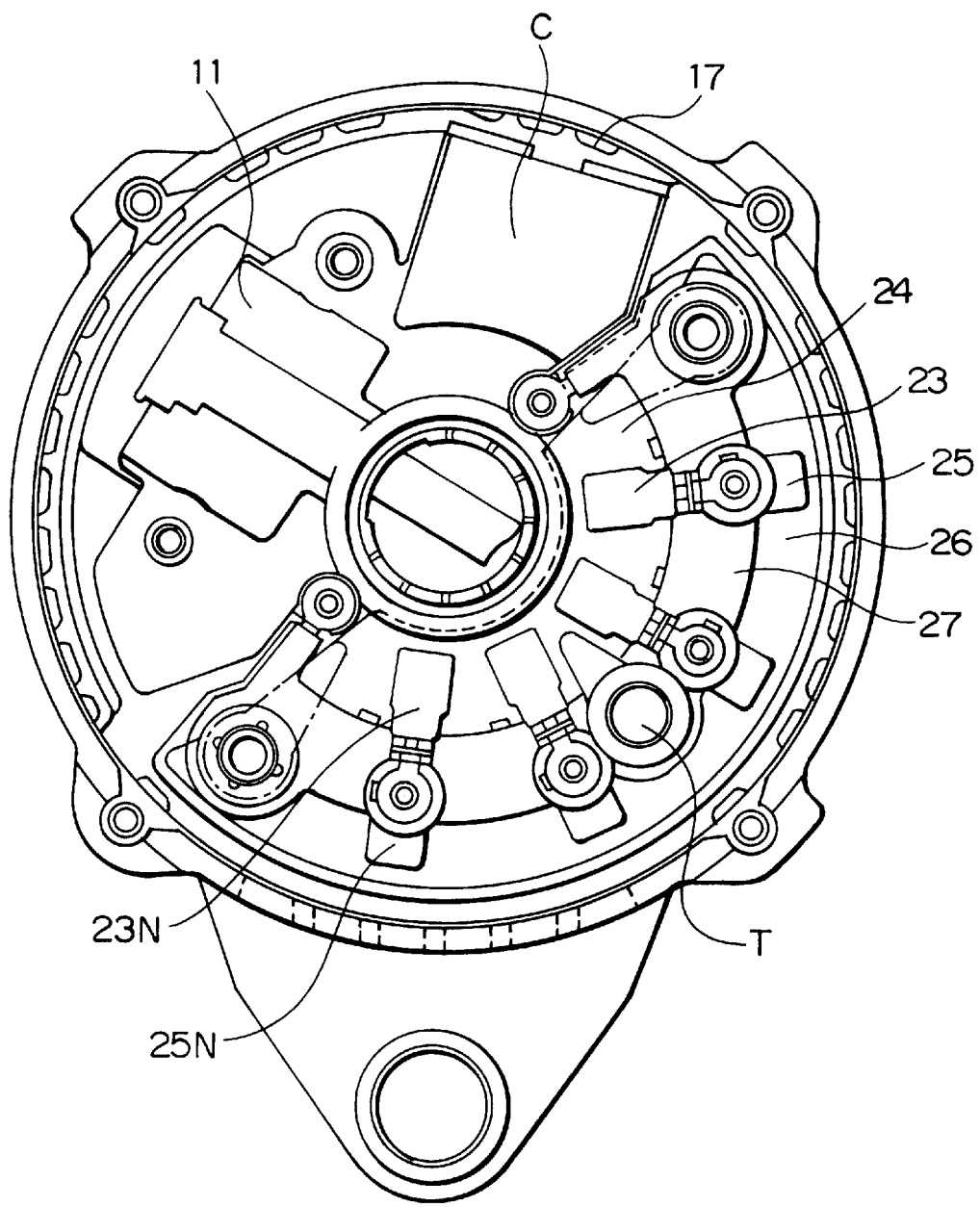
FIG. 14 is an internal view of the rear bracket of a conventional vehicular three-phase generator.
Figure 15:
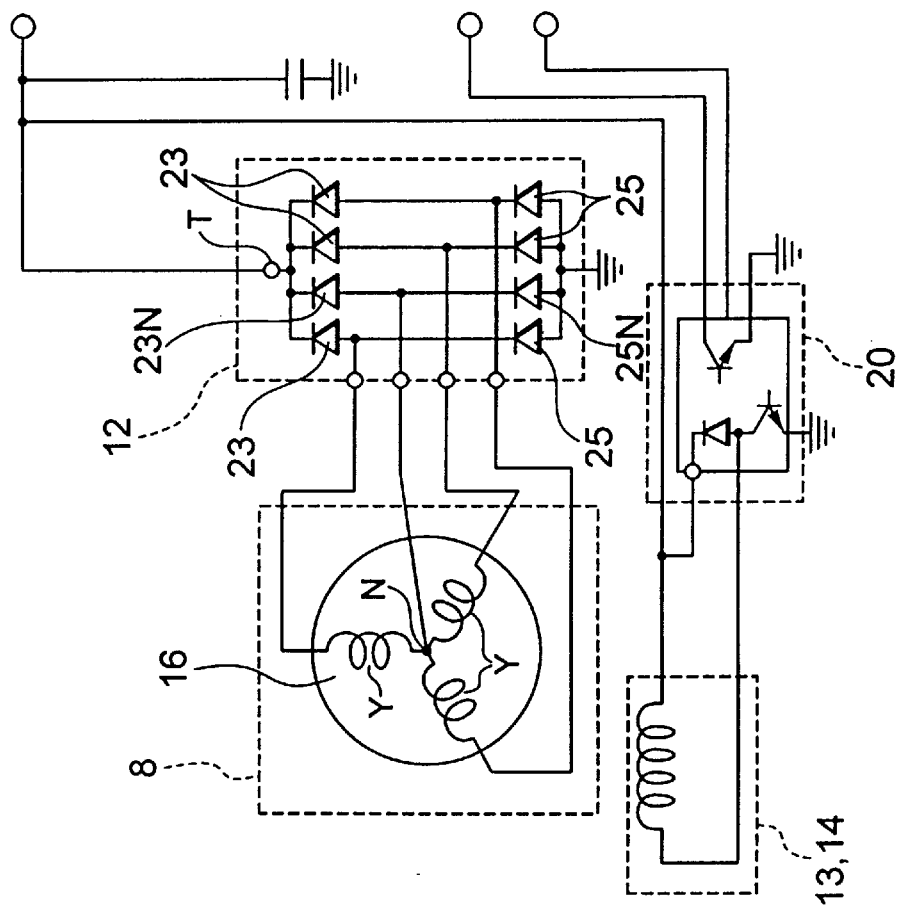
FIG. 15 is a circuit diagram of a conventional three-phase generator.
Figure 16:
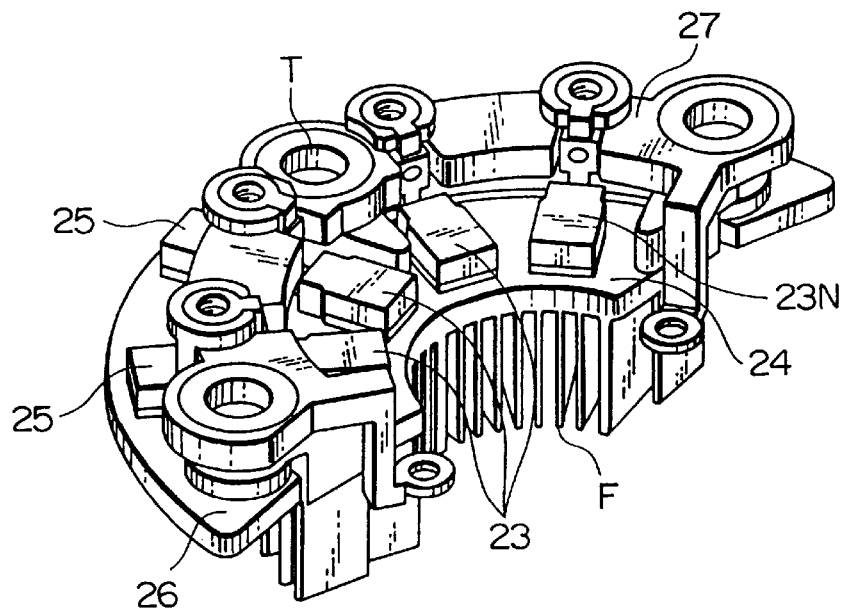
FIG. 16 is a perspective view of the rectifier device of a conventional vehicular three-phase generator.
Figure 17:
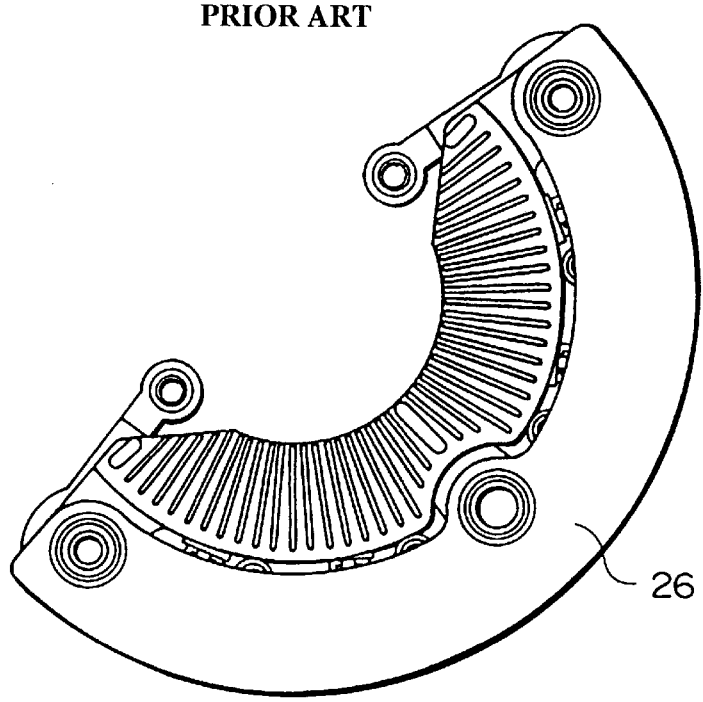
FIG. 17 is a side top view of the rear bracket of the rectifier device of a conventional vehicular three-phase generator.
Figure 18:
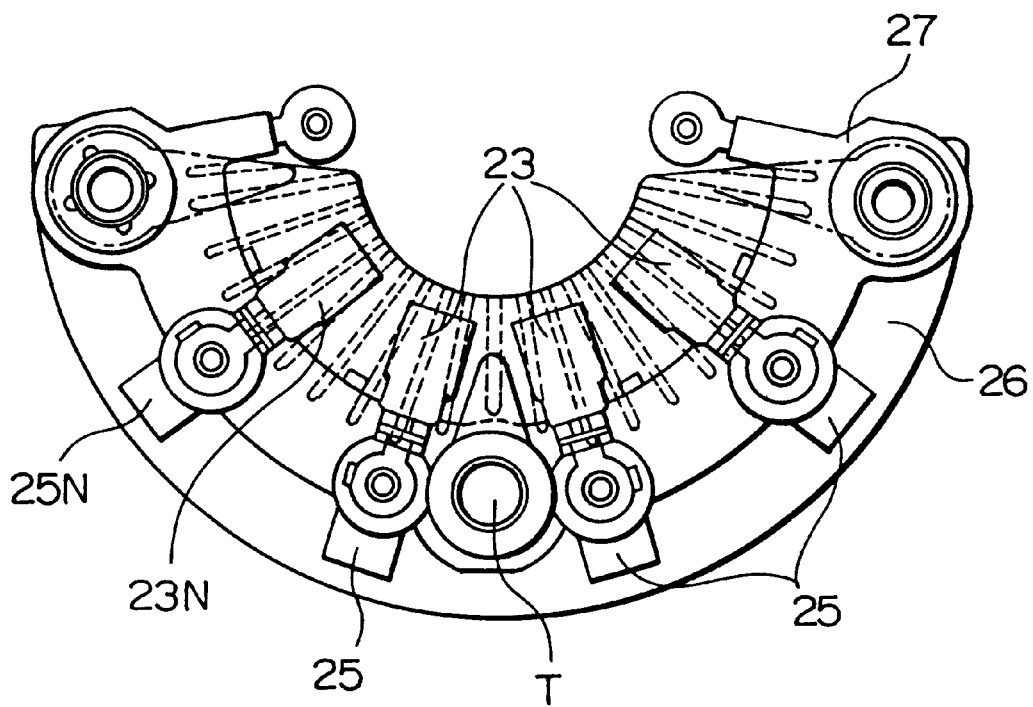
FIG. 18 is a front side top view of the rectifier device of a conventional vehicular three-phase generator.

The vehicular AC generator of embodiment 1 of the present invention will be described below with reference to FIGS. 1 to 3. FIG. 1 is an internal view showing the inside of the rear bracket 2 of the AC generator shown in, for example, FIG. 13. FIG. 2 shows two rectifiers RF1 and RF2 arranged in the rear bracket 2. FIG. 3 is a circuit diagram of an AC generator including the rectifiers RF1 and RF2.

In case of the AC generator of this embodiment, three first windings Y1 and three second windings Y2 are respectively connected in a Y-shaped configuration to provide a first and a second Y-shaped three-phase connection circuits 16-1 and 16-2, as shown in FIG. 3. The first and second rectifiers RF1 and RF2 are connected with output ends and neutral points N of the first and second windings Y1 and Y2, respectively, for rectifying outputs thereof and then generating a synthesized output at their output terminals T, respectively.

Three, first windings Y1 are successively received in the slot of a stator core 15 so as to have a phase difference of 120°. Moreover, it is apparent from Japanese Patent Application Laid-Open No. 6-178479 that ripples of rectifier outputs generated by the neutral-point diodes 23-1N, 25-1N, 23-2N and 25-2N are reduced by separately storing three second-windings Y2 in the same slot such that a phase difference of 120° is realized and a phase difference of 30° is formed between vectors of the respective first windings Y1.

Next, the arrangement or configuration of full-wave rectifying diodes and neutral-point diodes, comprising the first and second rectifiers RF1 and RF2 of the AC generator of the embodiment 1, on a heat sink will be described below with reference to FIGS. 1 and 2. Moreover, the heat sink is divided into two parts and then, assembled into one piece by joining output terminals in the rear bracket 2.

As shown in FIG. 1, anodes of three full-wave-rectifying negative-pole-side diodes 25-1 and a neutral-point-current-rectifying negative-pole-side neutral-point diode 25-1N together constituting the first rectifier RF1 are installed at a common negative-pole-side heat sink 26, and cathodes of three positive-pole-side diodes 23-1 and a neutral-point-current-rectifying positive-pole-side neutral-point diode 23-1N are installed at a common positive-pole-side heat sink 24. The positive-pole-side heat sink 24 is connected at an end thereof with the output terminal T.

Similarly, of three full-wave-rectifying negative-pole-side diodes 25-2 and a neutral-point-current-rectifying negative-pole-side neutral-point diode 25-2N together constituting the second rectifier RF2 are installed at the common negative-pole-side heat sink 26, and cathodes of three positive-pole-side diodes 23-2 and a neutral-point-current-rectifying positive-pole-side neutral-point diode 23-2N are installed at a common positive-pole-side heat sink 26. A negative-pole-side heat sink 24 is connected at an end thereof with the output terminal T.

Moreover, as shown in FIG. 2, cathodes of the negative-pole-side diodes 25-1, 25-1N, 25-2 and 25-2N whose anodes are connected to the negative-pole-side heat sink 26 of the first rectifier RF1 or second rectifier RF2 and anodes of the positive-pole-side diodes 23-1, 23-1N, 23-2 and 23-2N whose cathodes are connected to the positive-pole-side heat sink 24 are electrically connected to each other by a circuit panel 27 and then, connected to the outputs and neutral points N of the respective first windings Y1 and the respective second windings Y2 of the first and second Y-shaped three-phase-connection circuits 16-1 and 16-2.

In this embodiment, the neutral-point diodes 23-1N, 25-1N, 23-2N, and 25-2N, through which only a ripple-current component flows and which produce a small amount of heat, are arranged on respective heat sinks at positions farthest from the output terminal T so as to have the full-wave-rectifying diodes 23-1, 25-1, 23-2 and 25-2 between them.

Therefore, by using common heat sinks for neutral-point diodes and full-wave-rectifying diodes, it is possible to create an appropriate temperature distribution for the rectifier-with the heat produced by the diodes and to decrease the size of the rectifier.

Embodiment 2

Figure 4:
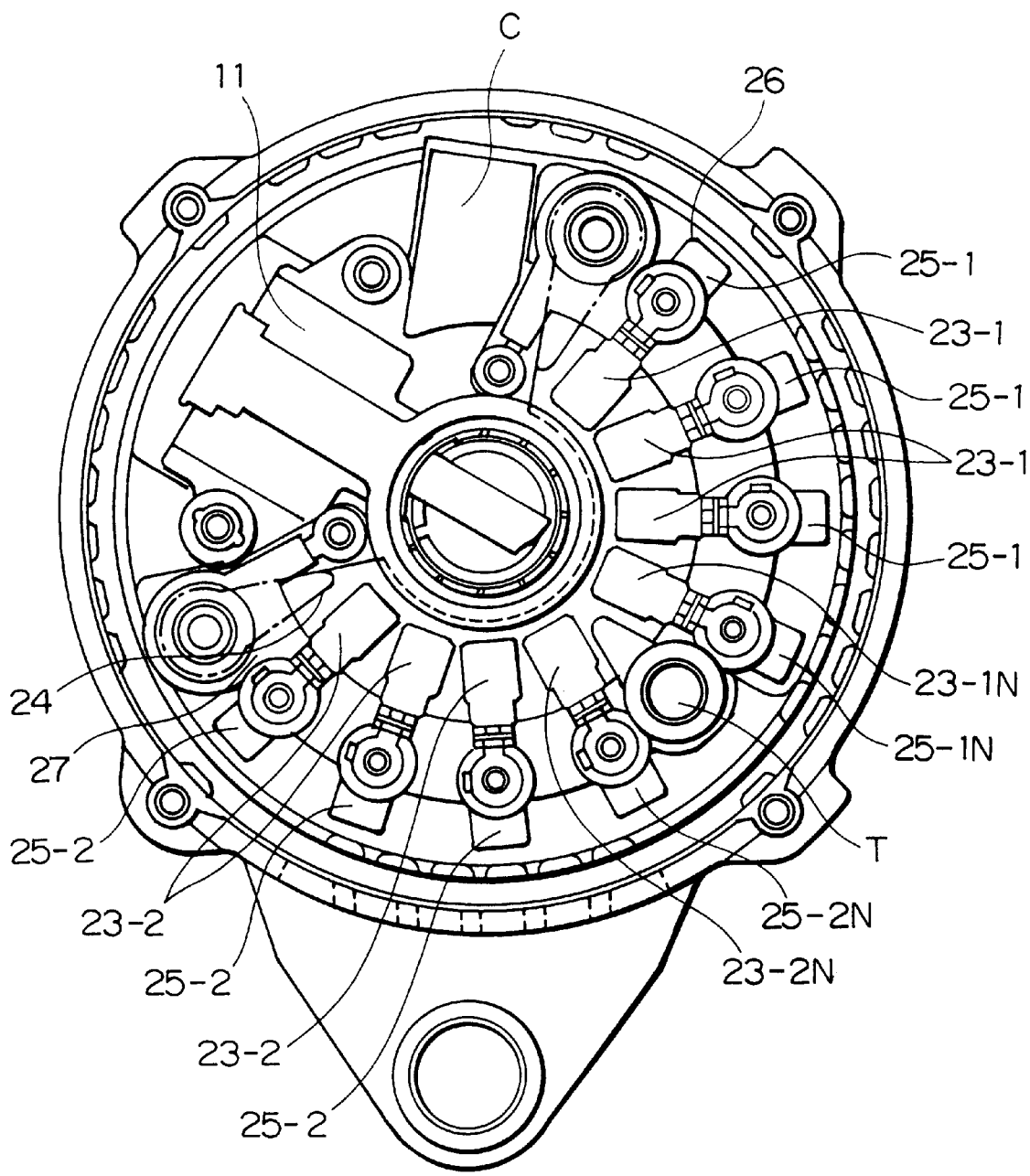
FIG. 4 is an internal view of the rear bracket of an embodiment 2.
Figure 5:
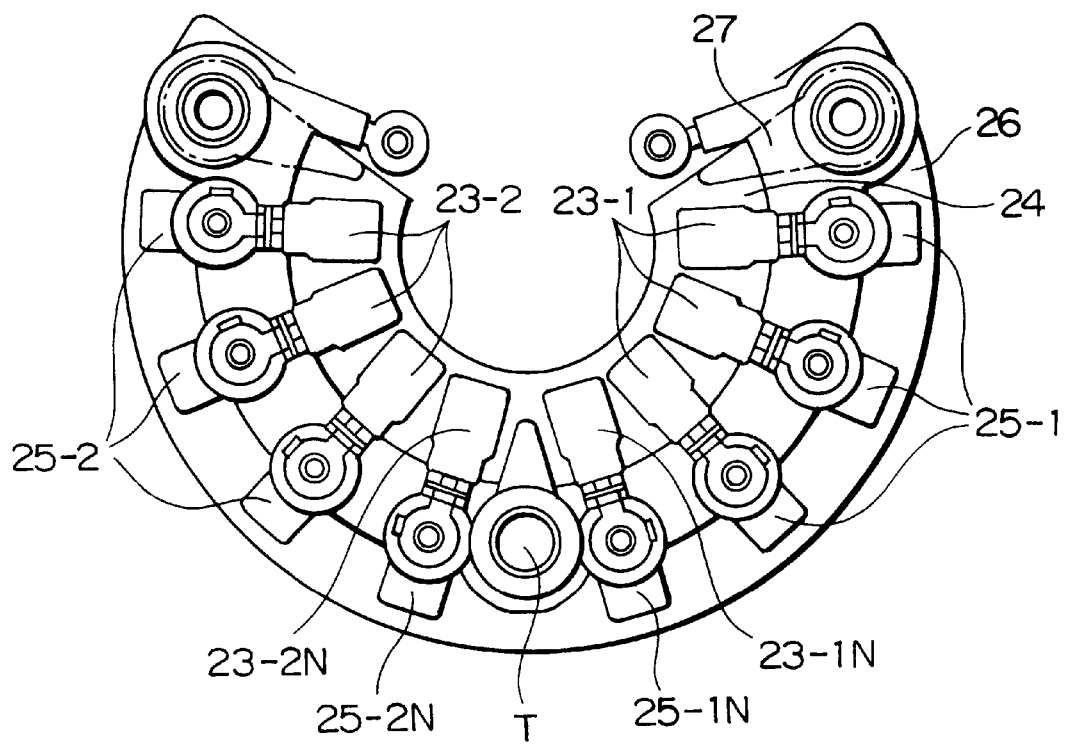
FIG. 5 is an illustration showing the rectifier device of the embodiment 2.
Figure 6:
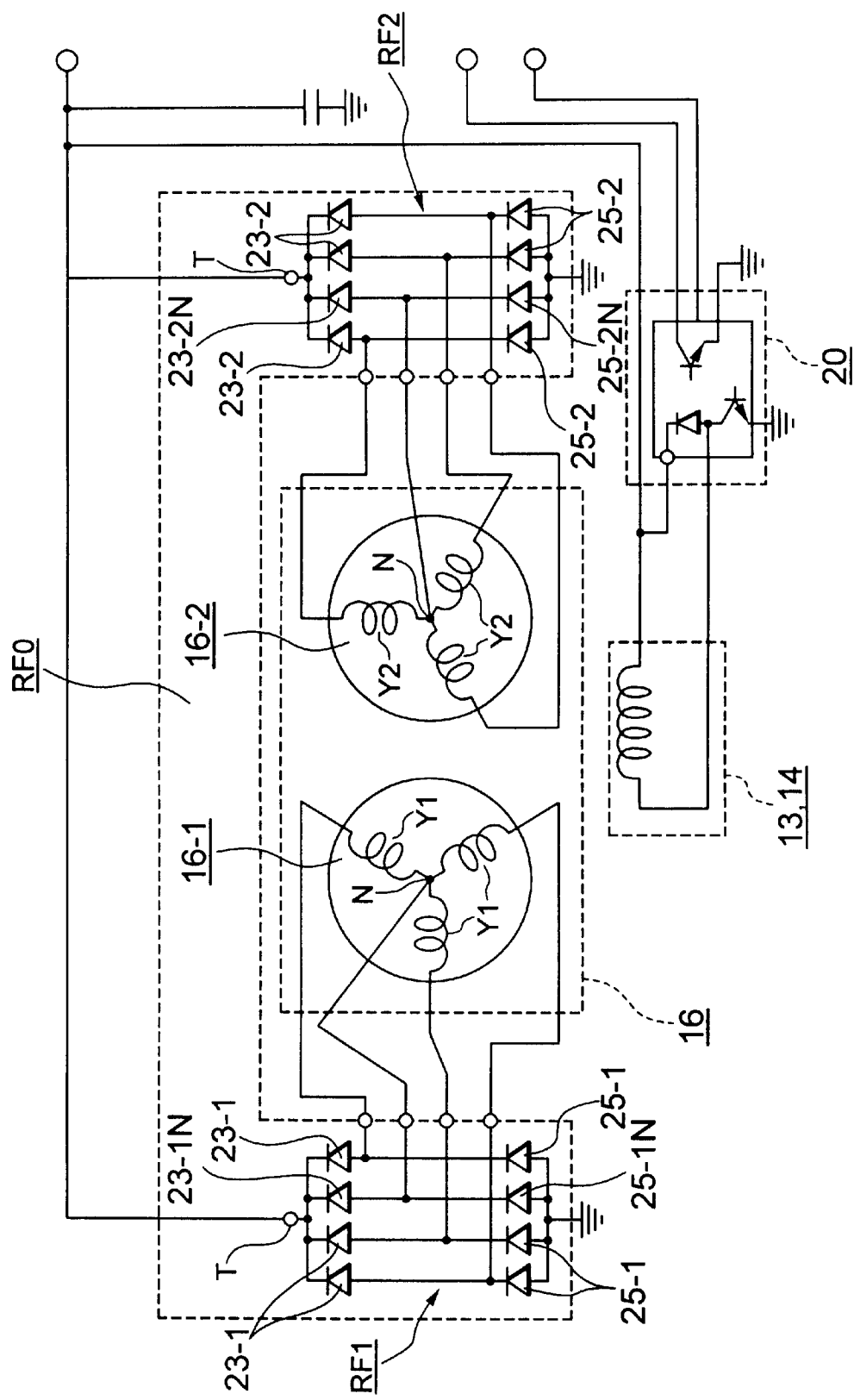
FIG. 6 is a circuit diagram of the vehicular AC generator of the embodiment 2.

The vehicular AC generator of embodiment 2 of the present invention will be described below with reference to FIGS. 4 and 5. FIG. 4 is an internal view showing the inside of the rear bracket 2 of the AC generator shown in, for example, FIG. 13. FIG. 5 is a rectifier device RF0 arranged in the rear bracket 2. FIG. 6 is a circuit diagram of an AC generator having the rectifier device RF0. In FIGS. 4 to 6, the same symbols as in FIGS. 1 to 3 show the same or corresponding portions.

In embodiment 2, unlike embodiment 1, heat sinks having the same polarity in rectifiers RF1 and RF2 are integrated as a rectifier device RF0 as shown in FIG. 5. Therefore, it is generally possible to further decrease the size of the rectifier device.

Moreover, because neutral-point diodes 25-1N, 23-1N, 25-2N and 23-2N respectively derive only a ripple-current component generated at a neutral point as an output, the amount of heat produced by the diodes is only 10 to 20% of the amount of heat produced by full-wave-rectifying diodes 25-1, 23-1, 25-2, and 23-2.

In addition, a full-wave-rectifying diode disposed next to an output terminal T provided at the center of a heat sink has the highest temperature among the full-wave-rectifying diodes 25-1, 23-1, 25-2 and 23-2. This is because the Joule heat produced by flowing a rectified output through the output terminal T and the increased amount of heat produced by the diodes accompanying the improvement in the generated output are combined to increase the temperature of the diodes.

Therefore, the neutral-point diodes 25-1N and 23-1N of the first rectifier RF1 and the neutral-point diodes 25-2N and 23-2N of the second rectifier RF2 for outputting only small-current-capacity ripple-current components generated at a neutral point N are symmetrically disposed on the heat sinks 24 and 26 next to the output terminal T, and the full-wave-rectifying diodes 25-1 and 23-1 of the first rectifier RF1 and the full-wave-rectifying diodes 25-2 and 23-2 of the second rectifier RF2 are symmetrically disposed next to the neutral-point diodes, respectively, as shown in FIGS. 4 and 5.

By arranging the diodes in the above-described manner to configure the rectifier device RF0, it is possible to decrease the size of the rectifiers in the embodiment 1 by using the same-polarity heat sinks 24 and 26 of the rectifier device RF0 in common. Moreover, by properly arranging neutral-point diodes, the temperature distribution is equalized and as a result, the temperature of the maximum-temperature portion of a full-wave-rectifying diode is lowered by 5° compared to a conventional example and the cooling effect is improved.

Embodiment 3

Figure 7:
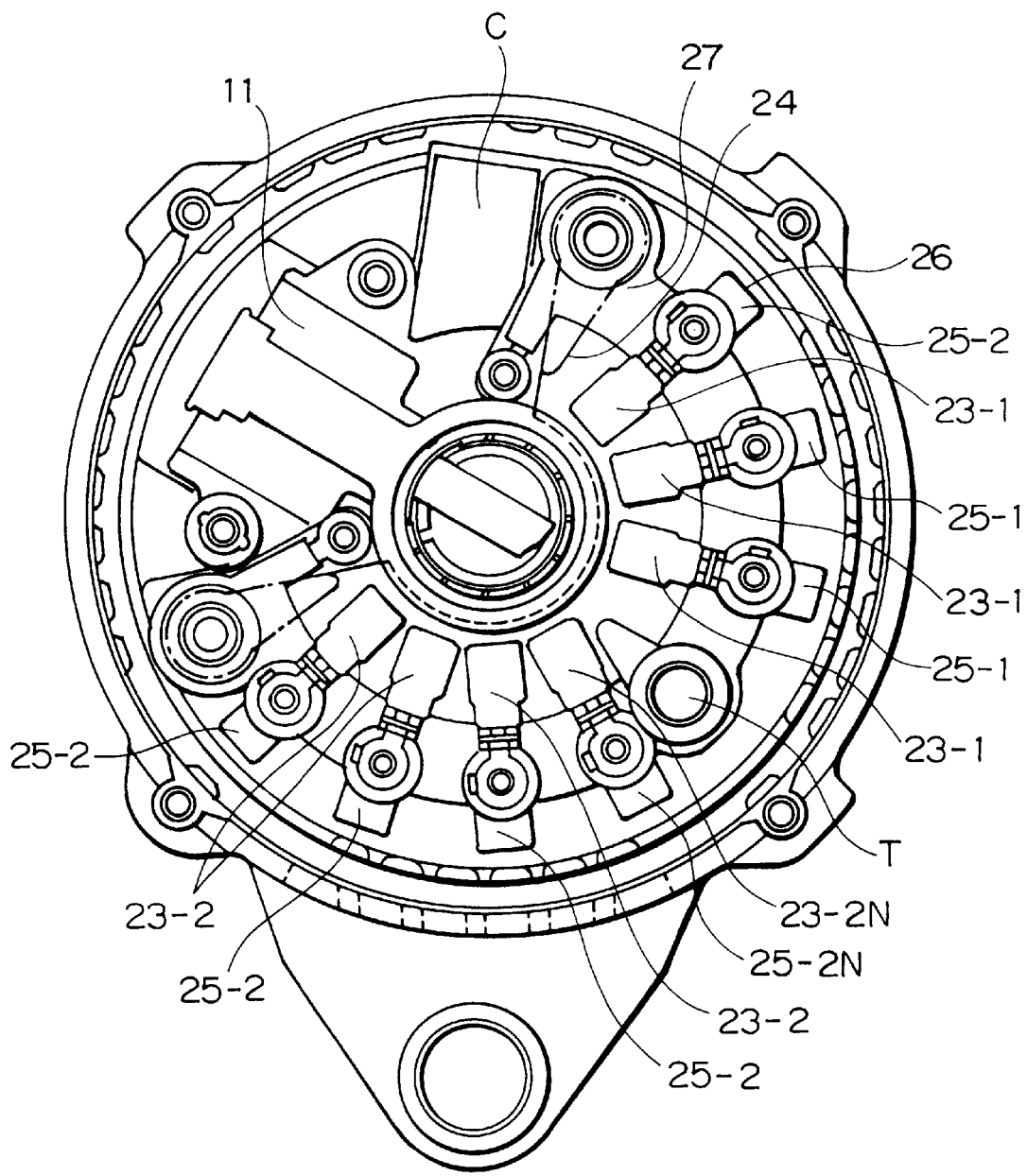
FIG. 7 is an internal view of the rear bracket of an embodiment 3.
Figure 8:
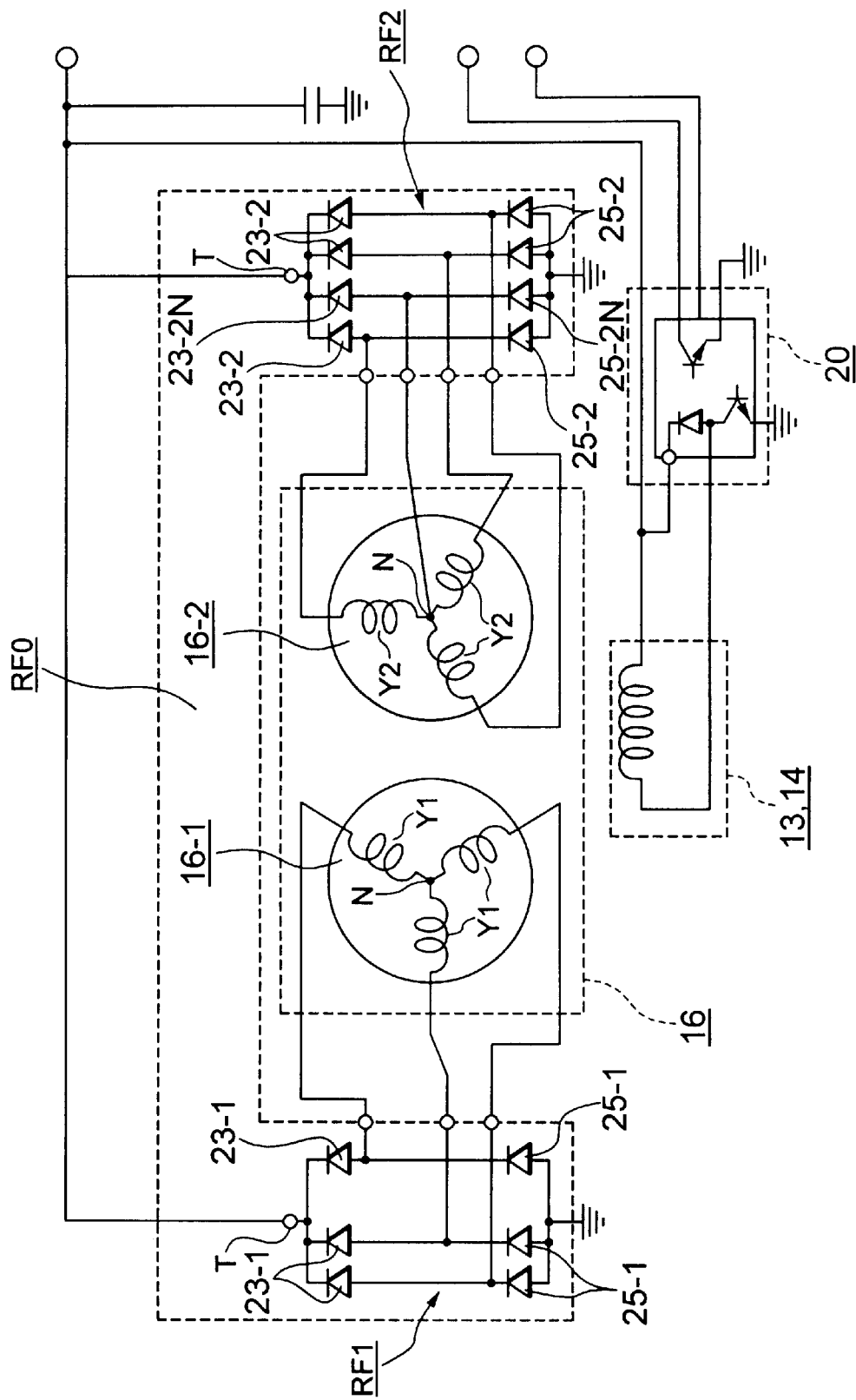
FIG. 8 is a circuit diagram of the vehicular AC generator of the embodiment 3.

The vehicular AC generator of embodiment 3 of the present invention will be described below with reference to FIGS. 7 and 8. FIG. 7 is an internal view showing the inside of the rear bracket 2 of the AC generator shown in FIG. 13. FIG. 8 is a circuit diagram of an AC generator including a rectifier device RF0. In FIGS. 7 and 8, the same symbols as those used in FIGS. 1 to 3 show the same or corresponding portions.

In this embodiment, in contrast to embodiments 1 and 2, the rectifier device RF0 is further downsized by arranging neutral-point diodes only on a second rectifier RF2 as shown in FIG. 8.

Moreover, the temperature of full-wave-rectifying diodes 23-1 and 25-1 disposed at the connector-C side where the cooling performance is poor due to cooling air leaks becomes higher on the whole. Therefore, to equalize the temperature distribution, neutral-point diodes 23-2N and 25-2N producing a lower amount of heat are disposed between full-wave-rectifying diodes 23-2 and 25-2 so as to face a connector C and an output terminal T which is a region having the highest temperature on heat sinks 24 and 26. As a result, the temperature of the maximum-temperature portion of a full-wave-rectifying diode is lowered and the service life of the diode is lengthened.

Father, in embodiment 3, the power-generation-output improvement effect is not halved, even if the neutral-point diodes 23-2N and 25-2N are added to only the second rectifier RF2 as shown in FIG. 8. However, in the case where it is more preferable to improve the cooling effect by enlarging the non-mounting space of a heat sink or cut the cost of an AC generator by reducing the number of neutral-point diodes than it is to improve the generated output, the configuration of the rectifier device of this embodiment 3 is suitable.

Embodiment 4

Figure 9:
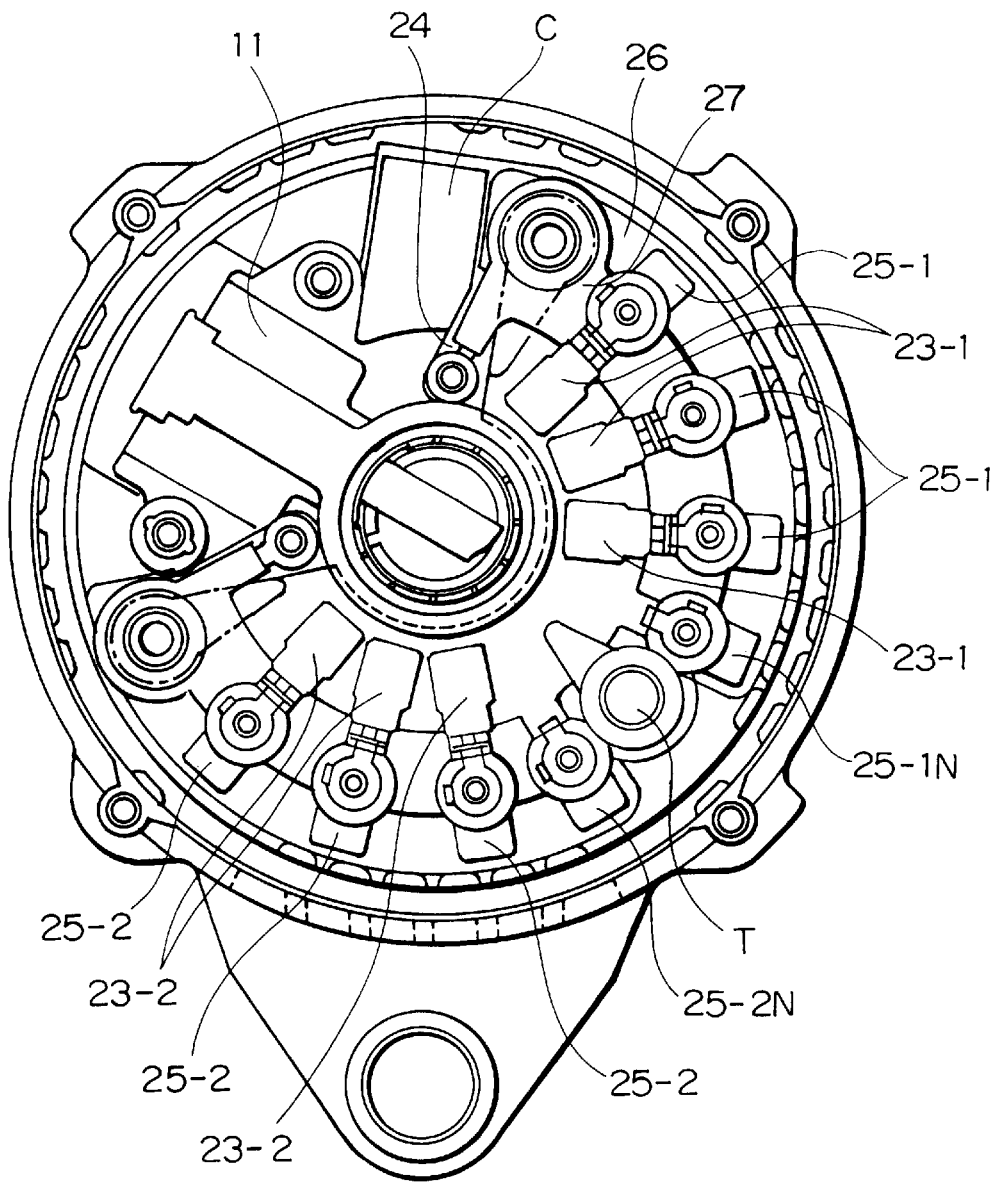
FIG. 9 is an internal view of the rear bracket of an embodiment 4.
Figure 10:
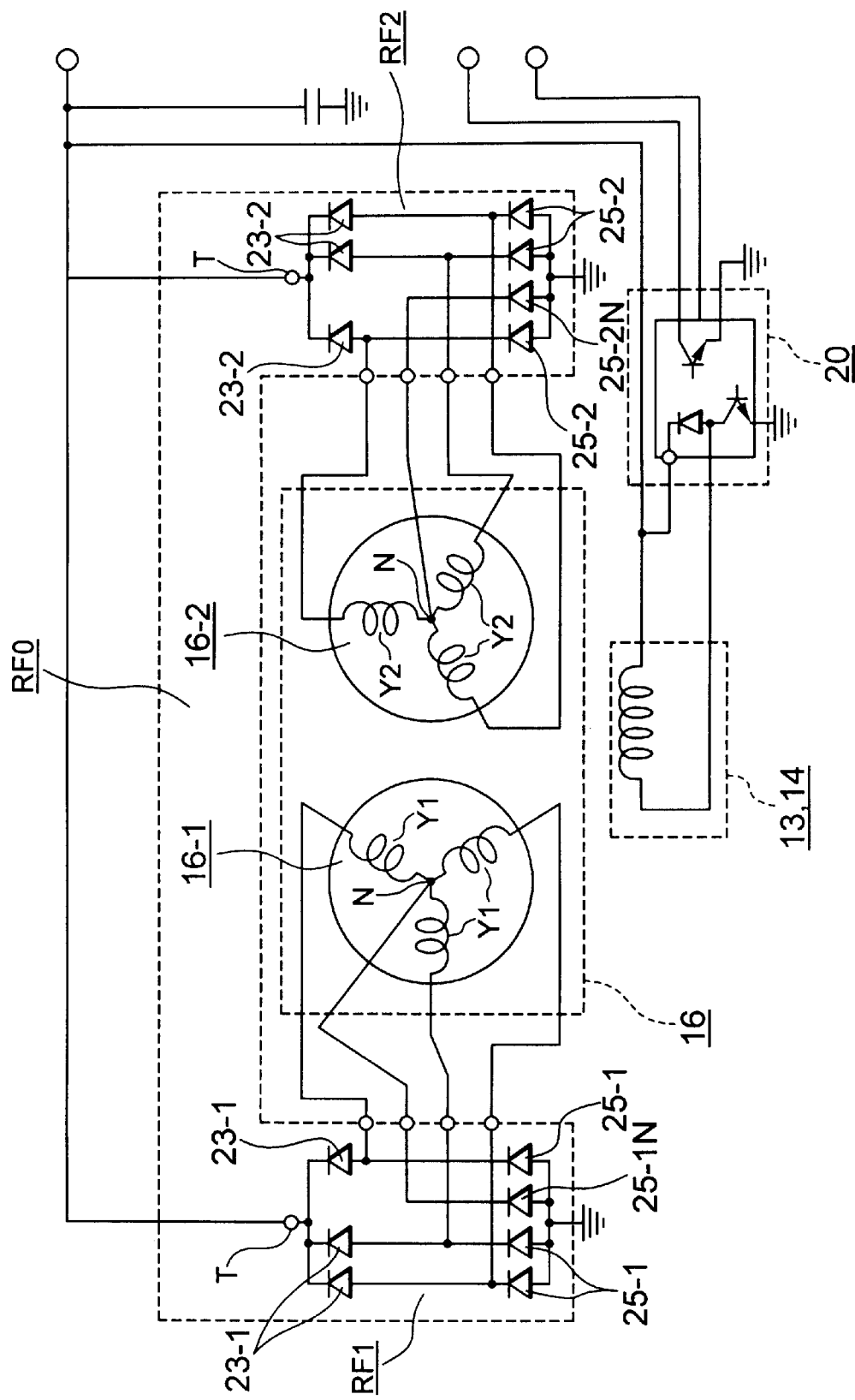
FIG. 10 is a circuit diagram of the vehicular AC generator of the embodiment 4.

The vehicular AC generator of embodiment 4 of the present invention will be described below with reference to FIGS. 9 and 10. FIG. 9 is an internal view showing the inside of the rear bracket 2 of the AC generator shown in, for example, FIG. 13. FIG. 10 is a circuit diagram of an AC generator having a rectifier device RF0. In FIGS. 9 and 10, the same symbols as those used in FIG. 1 show the same or corresponding portion.

In embodiment 3, unlike embodiment 1 neutral-point diodes 23-1N, 25-1N, 23-2N, and 23-2N are arranged on only the negative-pole sides of a first rectifier RF1 and a second rectifier RF2 as shown in FIG. 10, and the neutral-point diodes 25-1N and 25-2N are arranged at the opposite sides of an output terminal T on a negative-pole-side heat sink 26 as shown in FIG. 9.

This is because the negative-pole-side heat sink 26 has a large mounting area for the anode portion compared to that of heat sink 24 and the distance between the heat sink 26 and an adjacent full-wave-rectifying diode can be increased.

Moreover, by arranging neutral-point diodes 25-1N and 25-2N next to full-wave-rectifying diodes 23-1, 25-1, 23-2, and 25-2 at the output terminal-T side, which has the highest temperature in the negative-pole-side heat sink 26, the temperature distribution is equalized and as a result, the temperature of the maximum-temperature portion of a full-wave-rectifying diode is lowered and the service life of the diode can be lengthened.

By configuring a rectifier device as described above, when it is more preferable to improve the cooling effect by enlarging the non-mounting space on a heat sink or cut the cost of an AC generator by decreasing the number of neutral-point diodes than it is to improve the rectified output, the configuration of the rectifier device of this embodiment 4 is suitable.

Embodiment 5

Figure 11:
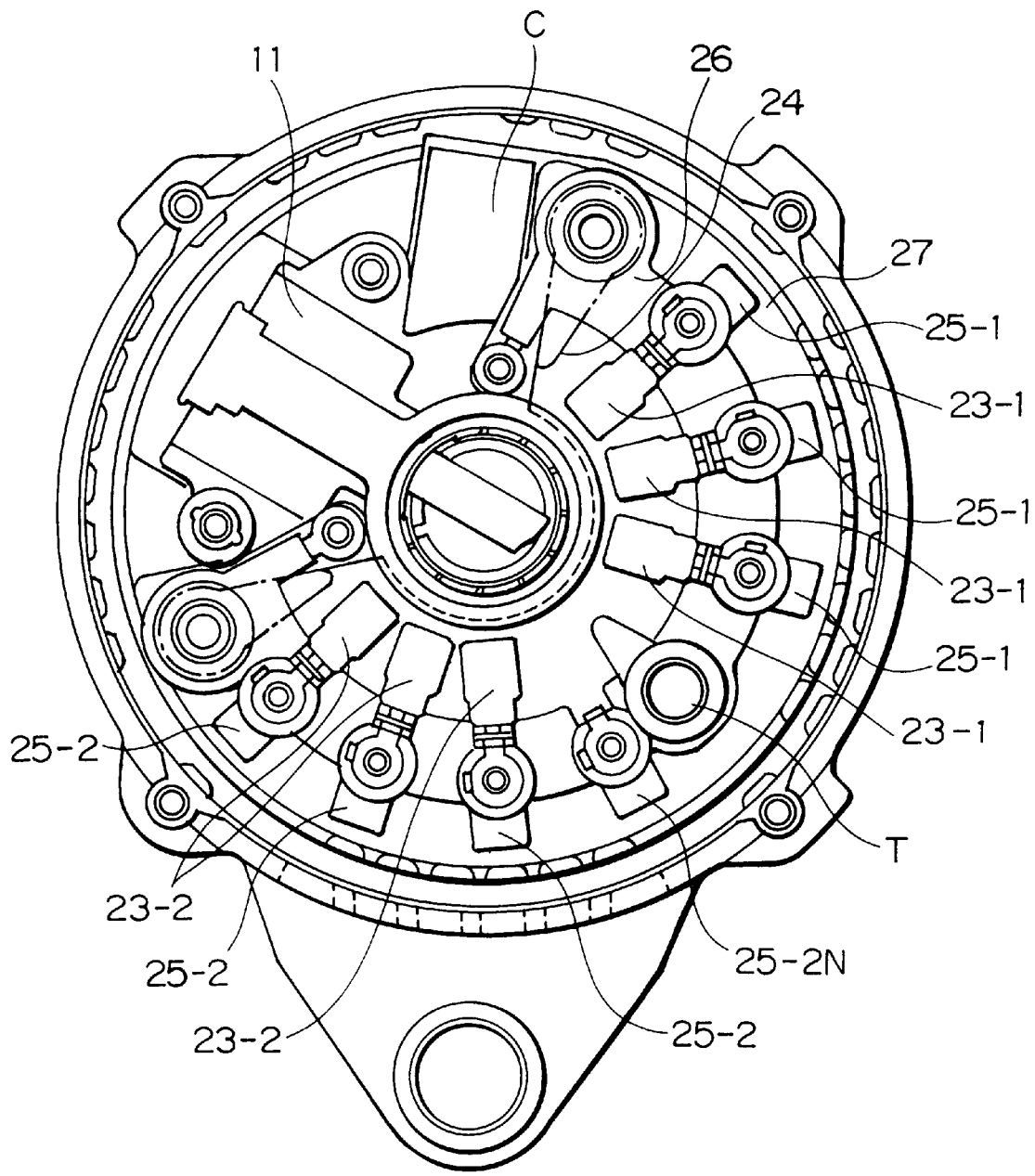
FIG. 11 is an internal view of the rear bracket of an embodiment 5.
Figure 12:
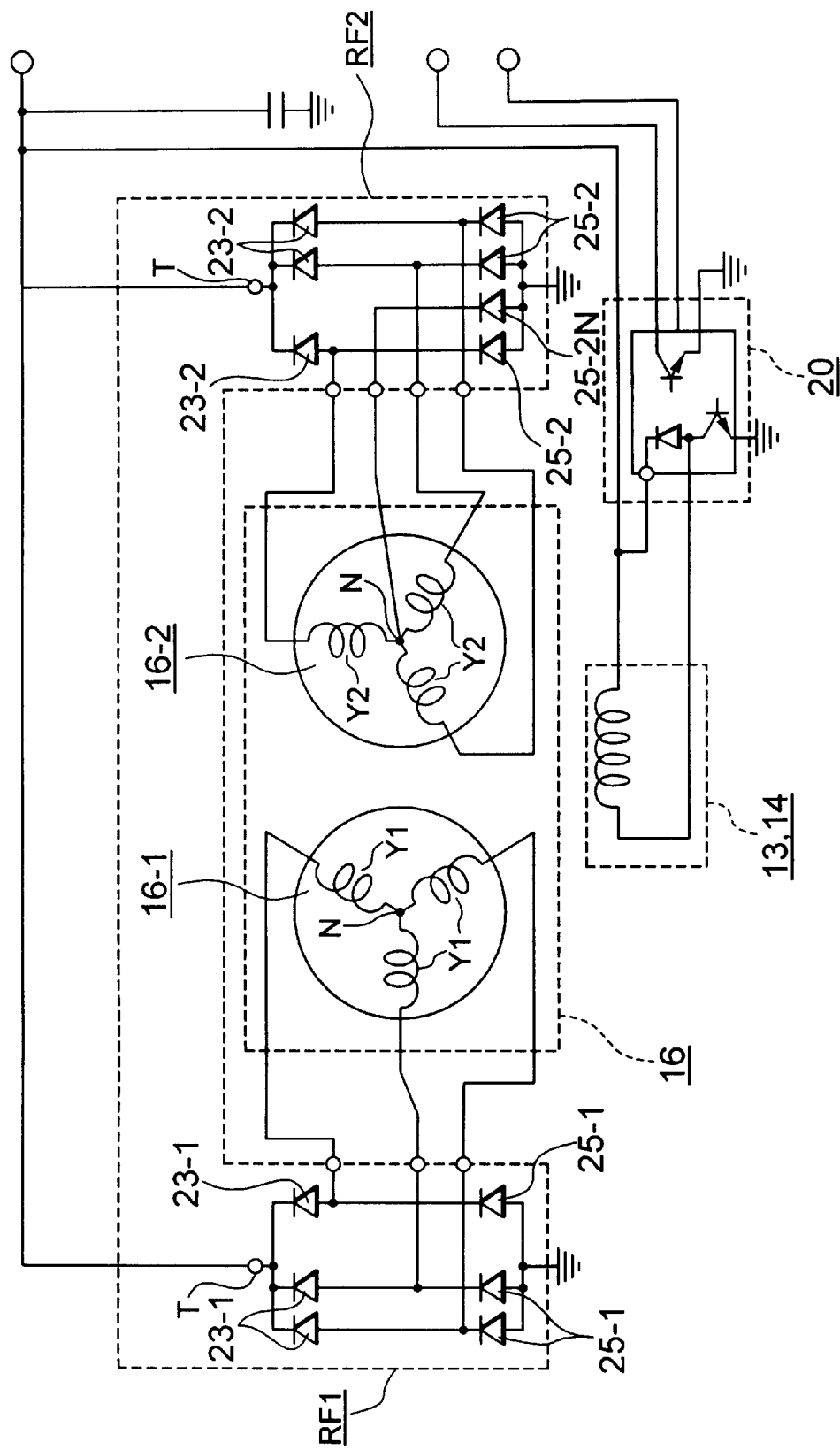
FIG. 12 is a circuit diagram of the vehicular AC generator of the embodiment 5.

The vehicular AC generator of embodiment 5 of the present invention will be described below with reference to FIGS. 11 and 12. FIG. 11 is an internal view showing the inside of the rear bracket 2 of the AC generator shown in, for example, FIG. 13. FIG. 12 is a circuit diagram of an AC generator having the rectifier device RF0. In FIGS. 11 and 12, the same symbols as those used in FIG. 1 show the same or corresponding portions.

In this embodiment, in contrast to embodiment 4, a neutral-point diode is arranged only at the negative-pole side of the second rectifier RF2 as shown in FIG. 12, and in addition the neutral-point diode 25-2N is arranged next to an output terminal T on a negative-pole-side heat sink 26 as shown in FIG. 11.

This is because the negative-pole-side heat sink 26 has a large mounting area for the anode portion compared to that of a positive-pole-side heat sink 24 and the distance between the heat sink 26 and an adjacent full-wave-rectifying diode can be increased.

Furthermore, by setting the neutral-point diode 25-2N next to an output terminal T having the highest temperature in the negative-pole-side heat sink 26, the temperature distribution is equalized and as a result, the temperature of the maximum temperature portion of a full-wave-rectifying diode is lowered and the service life of the diode is lengthened.

By configuring a rectifier device as described above, when it is more preferable to improve the cooling effect by enlarging the non-mounting space of a heat sink or cut the cost of an AC generator by decreasing the number of neutral-point diodes than it is to improve the rectified output, the configuration of the rectifier device of this embodiment 5 is suitable.

What is claimed is:

1. A vehicular AC generator comprising:

first and second Y-shaped three-phase connection stator windings having a Y-connection formed on a common stator core such that a pair of three windings have a phase difference of 30° from each other, each of the pair of windings being accommodated in separate slots of the common stator core; and a rectifier device comprising a first rectifier for rectifying and outputting a phase current derived from an end of each winding of the first Y-shaped three-phase connection stator winding and a neutral-point current derived from a neutral point of the first stator winding and a second rectifier for rectifying and outputting a phase current derived from an end of each winding of the second Y-shaped three-phase connection stator winding and a neutral-point current derived from a neutral point of the second stator winding, the first and second rectifiers each generating a synthesized output at an output terminal;

wherein the first and second Y-shaped three-phase connection stator windings have the same physical characteristics as each other, such that the phase current derived from the first Y-shaped three-phase connection stator winding equals the phase current derived from the second Y-shaped three-phase connection stator winding;

wherein the first and second rectifiers each have phase-current rectifying diodes and neutral-point-current rectifying diodes disposed on a common heat sink; and wherein the neutral-point-current rectifying diodes of the first and second rectifiers are disposed on the heat sink at locations next to a phase-current rectifying diode which will reach the highest temperature among the phase-current rectifying diodes.

2. The vehicular AC generator according to claim 1, wherein the neutral-point-current rectifying diodes of the first and second rectifiers are disposed at opposite sides of the output terminal, and the phase-current rectifying diodes are disposed on the heat sink at locations next to each of the neutral-point-current rectifying diodes.

3. A vehicular AC generator comprising:

first and second Y-shaped three-phase connection stator windings having a Y-connection formed on a common stator core such that a pair of three windings have a phase difference of 30° from each other, each of the pair of windings being accommodated in separate slots of the common stator core; and a rectifier device comprising a first rectifier for rectifying and outputting a phase current derived from an end of each winding of the first Y-shaped three-phase connection stator winding and a neutral-point current derived from a neutral point of the first stator winding and a second rectifier for rectifying and outputting a phase current derived from an end of each winding of the second Y-shaped three-phase connection stator winding and a neutral-point current derived from a neutral point of the second stator winding, the first and second rectifiers each generating a synthesized output at an output terminal;

wherein the first and second rectifiers each have phase-current rectifying diodes and neutral-point-current rectifying diodes disposed on a common heat sink; and wherein the neutral-point-current rectifying diodes of the first and second rectifiers are disposed at either a negative-pole side or a positive-pole side of the rectifiers.

4. A vehicular AC generator comprising:

first and second Y-shaped three-phase connection stator windings having a Y-connection formed on a common stator core so that a pair of three windings have a phase difference of 30° from each other, each of the pair of windings being accommodated in separate slots of the common stator core; and a rectifier device comprising a first rectifier for rectifying and outputting a phase current derived from an end of each winding of the first Y-shaped three-phase connection stator winding and a neutral-point current derived from a neutral point of the first stator winding, and a second rectifier for rectifying and outputting a phase current derived from an end of each winding of the second Y-shaped three-phase connection stator winding, the first and second rectifiers being each disposed to generate a synthesized output at an output terminal;

wherein the first rectifier has phase-current rectifying diodes and the second rectifier has phase-current rectifying diodes and neutral-point-current rectifying diodes, the phase-current rectifying diodes of the first rectifier and the phase-current rectifying diodes and the neutral-point-current rectifying diodes of the second rectifier being disposed on a common heat sink; and wherein the neutral-point-current rectifying diodes of the second rectifier are disposed on a heat sink at locations next to a phase-current rectifying diode that will reach the highest temperature among the phase-current rectifying diodes.

5. The vehicular AC generator according to claim 4, wherein phase-current rectifying diodes of the first and second rectifiers are disposed at opposite sides of an output terminal on the heat sink, and the neutral-point-current rectifying diodes are disposed between the output terminal and the phase-current rectifying diodes.

6. A vehicular AC generator comprising:

first and second Y-shaped three-phase connection stator windings having a Y-connection formed on a common stator core so that a pair of three windings have a phase difference of 30° from each other, each of the pair of windings being accommodated in separate slots of the common stator core; and a rectifier device comprising a first rectifier for rectifying and outputting a phase current derived from an end of each winding of the first Y-shaped three-phase connection stator winding and a neutral-point current derived from a neutral point of the first stator winding, and a second rectifier for rectifying and outputting a phase current derived from an end of each winding of the second Y-shaped three-phase connection stator winding, the first and second rectifiers being each disposed to generate a synthesized output at an output terminal;

wherein the first rectifier has phase-current rectifying diodes and the second rectifier has phase-current rectifying diodes and neutral-point-current rectifying diodes, the phase-current rectifying diodes of the first rectifier and the phase-current rectifying diodes and the neutral-point-current rectifying diodes of the second rectifier being disposed on a common heat sink; and wherein the neutral-point-current rectifying diodes of the second rectifier are disposed at either a negative-pole side or a positive-pole side of the second rectifier.

* * * * *